United States Patent
Chen et al.

(10) Patent No.: US 6,727,134 B1
(45) Date of Patent: Apr. 27, 2004

(54) METHOD OF FORMING A NITRIDE GATE DIELECTRIC LAYER FOR ADVANCED CMOS DEVICES

(75) Inventors: Chi-Chun Chen, Kaohsiung (TW); Tze-Liang Lee, Hsin-Chu (TW); Shih-Chang Chen, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/288,195

(22) Filed: Nov. 5, 2002

(51) Int. Cl.$^7$ .......................................... H01L 21/8238
(52) U.S. Cl. ...................... 438/216; 438/287; 438/585; 438/591
(58) Field of Search ................. 438/216, 287, 438/197, 520, 528, 585, 591

(56) References Cited

U.S. PATENT DOCUMENTS

| | | | |
|---|---|---|---|
| 6,033,998 A | * | 3/2000 | Aronowitz et al. ......... 438/786 |
| 6,087,229 A | * | 7/2000 | Aronowitz et al. ......... 438/287 |
| 6,225,169 B1 | * | 5/2001 | Chew et al. ................ 438/287 |
| 6,228,779 B1 | * | 5/2001 | Bloom et al. ............... 438/763 |
| 6,348,420 B1 | * | 2/2002 | Raaijmakers et al. ....... 438/769 |
| 6,362,085 B1 | * | 3/2002 | Yu et al. .................... 438/585 |
| 6,436,771 B1 | * | 8/2002 | Jang et al. .................. 438/275 |

* cited by examiner

Primary Examiner—Don Wong
Assistant Examiner—Thuy Vinh Tran
(74) Attorney, Agent, or Firm—George O. Saile; Stephen B. Ackerman

(57) ABSTRACT

A process for forming a dielectric stack for use as a gate dielectric layer for sub-0.1 um MOSFET devices has been developed. The process features growth of a thin silicon nitride layer on the surface of a semiconductor substrate via a low temperature plasma nitridization procedure. The conditions used allow a self-limiting silicon nitride layer, in regards to thickness, to be realized. A plasma oxidation procedure is next used to remove bulk traps in the silicon nitride layer in addition to forming a thin silicon oxide layer on the semiconductor surface, underlying the thin silicon nitride layer. The plasma oxidation procedure also results in conversion of a top portion of the silicon layer to silicon oxynitride, thus resulting in a dielectric gate stack comprised of silicon oxynitride-silicon oxide-silicon nitride.

28 Claims, 2 Drawing Sheets

*Ultra Thin, Vitccle Uniformity*

| Sample # | Nitridation Conditions | Nitride Thickness |
|---|---|---|
| 1 | $N_2$, 650°C, 10sec | 9.6Å |
| 2 | $N_2$, 650°C, 20sec | 9.8Å |
| 3 | $N_2$, 650°C, 30sec | 10.0Å |

*FIG. 4*

METHOD OF FORMING A NITRIDE GATE DIELECTRIC LAYER FOR ADVANCED CMOS DEVICES

BACKGROUND OF THE INVENTION (1) Field of the Invention

The present invention relates to methods used to fabricate semiconductor devices, and more specifically to a method used to form a gate dielectric layer comprised with silicon nitride, for complimentary metal oxide semiconductor (CMOS), devices.

(2) Description of Prior Art

The emergence of micro-miniaturization has allowed metal oxide semiconductor field effect transistor (MOSFET), or complimentary metal oxide semiconductor (CMOS), devices featuring sub-0.10 um channel lengths to be realized. Advances in specific semiconductor fabrication disciplines, such as photolithography and dry etching, have in part been responsible for attainment of the devices comprised with sub-micron features. The use of micro-miniaturization also necessitates the use of ultra-thin gate dielectric layers, wherein the thinner gate dielectric layers have to withstand device operating conditions experienced by thicker gate dielectric counterparts. The use of a composite dielectric stack such as a silicon nitride-silicon oxide layer offers dielectric strength comparable to thicker silicon oxide gate dielectric counterparts and thus is a desirable candidate for use in sub-0.10 um MOSFET devices, however the process sequence used to form the silicon nitride-silicon oxide stack can be cumbersome, costly and difficult to control the ultra-thin components of the stack. Generally a four step process sequence, featuring growth of an underlying silicon oxide layer, deposition of a thin silicon nitride layer, a high temperature anneal, and a high temperature reoxidation, is used for attainment of the silicon nitride-silicon oxide gate stack. This process sequence can result in thicker than desired stack components via the use of the required higher deposition, anneal, and reoxidation temperatures.

The present invention will describe a simplified process sequence in which a thin nitride-oxide gate dielectric stack is formed, featuring low temperature processing, and featuring improved thickness uniformity, yield and reliability, when compared to counterpart gate dielectric stacks prepared without the use of this invention. Prior art such as Bloom et al, in U.S. Pat. No. 6,228,779 B1, Chew et al, in U.S. Pat. No. 6,225,169 B1, Raaijamakers et al, in U.S. Pat. No. 6,348,420 B1, and Yu et al, in U.S. Pat. No. 6,362,085 B1, describe methods of forming composite dielectric stacks, however none of the prior art describe the novel process sequence detailed in the present invention.

SUMMARY OF THE INVENTION

It is an object of this invention to form a nitride-oxide stack for use as a gate dielectric in complimentary metal oxide semiconductor (CMOS), devices.

It is another object of this invention to initially form the nitride component of the nitride-oxide stack on a semiconductor substrate, via a plasma nitridization procedure which provides excellent nitride thickness uniformity and controllability, independent of plasma nitridization time.

It is still another object of this invention to employ a subsequent plasma oxidation procedure to grow the underlying oxide component of the nitride-oxide stack on the surface of an underlying semiconductor substrate, with the same plasma oxidation procedure removing bulk traps in the overlying nitride component.

In accordance with the present invention a method of forming a nitride-oxide stack for use as a gate dielectric layer featuring a plasma nitridization procedure to uniformly and controllably form the nitride component of the dielectric stack on a semiconductor substrate, and featuring a subsequent plasma oxidation procedure used to form the underlying oxide component of the dielectric stack on the surface of the semiconductor substrate while repairing bulk traps in the nitride component, is described. A plasma nitridization procedure is performed to grow a uniform, thin silicon nitride layer on the surface of a semiconductor substrate using a low growth temperature which allows the growth of the nitride component of the nitride-oxide stack to be self-limiting in regards to thickness. A plasma oxidation procedure is next in situ performed at a low temperature, removing bulk traps in the silicon nitride layer, while growing the thin silicon oxide component of the nitride-oxide stack on the surface of the semiconductor substrate, underlying the nitride component. The plasma oxidation procedure results in a top portion of the silicon nitride layer being converted to a silicon oxynitride layer. The removal of bulk traps result in a reliable nitride-oxide stack, while the low thermal budget of the plasma steps, and the in-situ plasma procedures result in wide process windows as well as process cost reductions.

BRIEF DESCRIPTION OF THE DRAWINGS

The object and other advantages of this invention are best described in the preferred embodiment with reference to the attached drawings that include:

FIG. 4, which in tabular form shows the controllability or self-limiting feature of the plasma nitridization procedure, wherein the thickness of nitride component of the nitride-oxide stack, is not influenced by time of nitridization.

DESCRIPTION OF THE PREFERRED EMBODIMENTS

Figure 1:
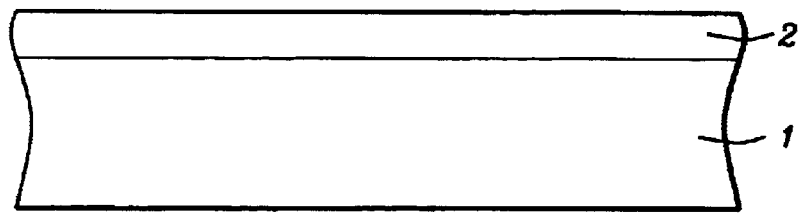
FIGS. 1–3, which schematically, in cross-sectional style, show key process stages used to form the nitride-oxide gate stack.

The method of forming a nitride-oxide stack for use as a gate dielectric layer, featuring a plasma nitridization procedure and a plasma oxidation procedure, used for self-limiting nitride growth and for removal of bulk traps in the nitride component, will now be described in detail. Semiconductor substrate 1, comprised of single crystalline, P type silicon, featuring a <100> crystalline orientation, is used and schematically shown in FIG. 1. A pre-clean procedure used to remove native oxide from the surface of semiconductor substrate 1, prior to the growth of silicon nitride, is performed using a hydrofluoric acid containing solution. The native oxide-free semiconductor substrate is then inserted in a chamber of a plasma tool and subjected to a remote plasma nitridization procedure resulting in the growth of ultra-thin silicon nitride layer 2, at a thickness between about 5 to 25 Angstroms. This is schematically shown in FIG. 1. The plasma nitridization procedure is performed in a nitrogen ambient, at a power between about 100 to 300 watts, at a pressure between about 1 mtorr to 10 torr, and at a temperature between about 25 to 700° C. The nitridization procedure is self-limiting in regards to the thickness of silicon nitride, with the diffusion of nitrogen to the surface of the semiconductor substrate influenced by the temperature of the procedure. Therefore by maintaining a nitridization temperature of about 650° C., a thickness of about 10 Angstroms of silicon nitride is reached in 10 sec, while increased RPN times of 20 and 30 sec, do not result in additional silicon nitride growth. In addition the use nitrogen as a source eliminates the inclusion of hydrogen in the silicon nitride layer thus improving the reliability of this layer. Other means of forming silicon nitride employ hydrogen containing reactants such as silane ($SiH_4$), and ammonia ($NH_3$). The refractive index of silicon nitride layer 2, obtained via the above RPN procedure is between about 1.95 to 2.05.

Figure 2:
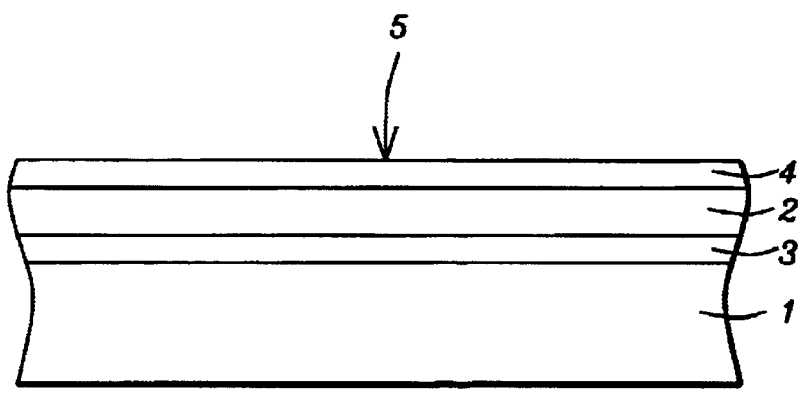

To improve the quality of plasma grown, silicon nitride layer 2, a plasma oxidation procedure is performed to remove bulk traps from silicon nitride layer 2. This is accomplished via a remote plasma oxidation (RPO), procedure, performed in situ, in the same tool or chamber used previously for attainment of silicon nitride layer 2. The plasma oxidation procedure is performed at a temperature between about 200 to 700° C., at a power between about 100 to 3000 watts, at a pressure between about 1 mtorr to 3 torr, in an oxygen ambient, for a time about 5 to 60 sec. In addition to remove bulk traps from silicon nitride layer 2, the RPO procedure results in the growth of silicon oxide layer 3, at a thickness between about 5 to 30 Angstroms, on the surface of semiconductor substrate 1, underlying silicon nitride layer 2. Diffusion of oxygen through silicon nitride layer 2, enabled the growth of silicon oxide layer 3, to be realized. The RPO procedure also converted a portion of the top surface of silicon nitride layer 2, to silicon oxynitride layer 4, at a thickness between about 6 to 30 Angstroms. Thus composite dielectric layer 5, shown schematically in FIG. 2, comprised of silicon oxynitride layer 4, silicon nitride layer 2, and silicon oxide layer 3, is formed with an equivalent oxide thickness (EOT), between about 5 to 20 Angstroms.

Figure 3:
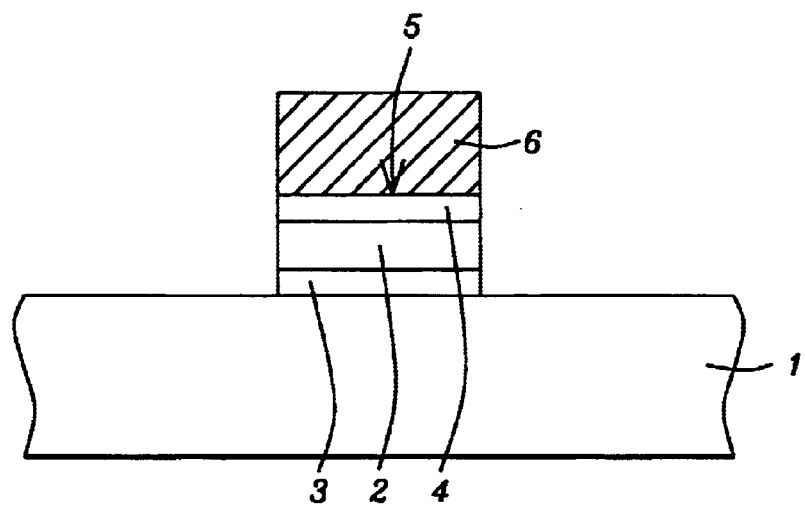

The employment of composite dielectric layer 5, as a gate dielectric layer is schematically shown in FIG. 3. A conductive layer such as doped polysilicon, metal silicide, or polycide (metal silicide on polysilicon), is deposited then patterned via conventional photolithographic and dry etching procedures to define conductive gate structure 6. The photoresist shape used as a mask for definition of conductive gate structure can remain during a selective dry etch procedure used to remove portions of composite dielectric layer 5, not covered by conductive gate structure 6. The selective dry etch procedure employs $CHF_3$ as an etchant for silicon oxide layer 3, selectively terminating at the top surface of semiconductor substrate 1. Thus the use of low temperature (about 650° C.), processing, and the absence of hydrogen containing reactants for attainment of silicon nitride, in addition to the low temperature, in situ procedure for removal of bulk traps in the silicon nitride layer, allowed self-limiting thickness as well as improved quality of an ultra-thin dielectric layer to achieved.

FIG. 4, in tabular form details the self-limiting thickness of silicon nitride via the remote plasma nitridization (RPN), procedure just described. It can be seen that increasing RPN time does not result in increased silicon nitride thickness as a result of the low temperature procedure limiting the diffusion of nitrogen through the already grown silicon nitride layer.

While this invention has been particularly shown and described with reference to the preferred embodiments thereof, it will be understood by those skilled in the art that various changes in form and details may be made without departing from the spirit and scope of this invention.

What is claimed is:

1. A method of forming a dielectric layer on a semiconductor substrate, comprising the steps of:

performing a first plasma procedure to form a first insulator layer on said semiconductor substrate; and performing a second plasma procedure to remove traps in said first insulator layer, with said second plasma procedure forming a second insulator layer on said semiconductor substrate underlying said first insulator layer, and converting a top portion of said first insulator layer to a third insulator layer, resulting in said dielectric layer comprised of said third insulator layer on a bottom portion of said first insulator layer, and an underlying second insulator layer.

2. The method of claim 1, wherein said first plasma procedure is a remote plasma nitridization procedure.

3. The method of claim 1, wherein said first plasma procedure is performed at a temperature between about 25 to 700° C.

4. The method of claim 1, wherein said first plasma procedure is performed at a power between about 100 to 300 watts, and at a pressure between about 1 mtorr to 10 torr.

5. The method of claim 1, wherein said first plasma procedure is performed for a time of 5 sec, or greater.

6. The method of claim 1, wherein said first plasma procedure is performed in a nitrogen ambient.

7. The method of claim 1, wherein said first insulator layer is a silicon nitride layer, formed at a thickness between about 5 to 30 Angstroms, via said first plasma procedure, formed independent of plasma time.

8. The method of claim 1, wherein a refractive index of said first insulator layer is between about 1.95 to 2.05.

9. The method of claim 1, wherein said second plasma procedure is a remote plasma oxidation procedure, performed in an oxygen ambient, in situ in same chamber used to perform said first plasma procedure.

10. The method of claim 1, wherein said second plasma procedure is performed at a temperature between about 200 to 700° C.

11. The method of claim 1, wherein said second plasma procedure is performed at a power between about 100 to 3000 watts, and at a pressure between about 1 mtorr to 10 torr.

12. The method of claim 1, wherein said second plasma procedure is performed for a time between about 5 to 60 sec.

13. The method of claim 1, wherein said second insulator layer is a silicon oxide layer, formed at a thickness between about 5 to 30 Angstroms.

14. The method of claim 1, wherein said third insulator layer is a silicon oxynitride layer, formed at a thickness between about 6 to 30 Angstroms.

15. The method of claim 1, wherein said dielectric layer comprised of said third insulator layer, of bottom portion of said first insulator layer, and of said second insulator layer is comprised with an equivalent oxide thickness (EOT), between about 5 to 20 Angstroms.

16. A method of forming a nitride-oxide composite stack layer for use as a gate dielectric layer, on a semiconductor substrate, comprising the steps of:

performing a wet clean procedure to remove native oxide from surface of said semiconductor substrate;

performing a plasma nitridization procedure in a plasma tool to form a silicon nitride layer on said semiconductor substrate; and performing a plasma oxidation procedure, in situ in said plasma tool, removing bulk traps in said silicon nitride layer while forming a silicon oxide layer on said semiconductor substrate located underlying said silicon nitride layer, and converting a top portion of said silicon nitride layer to a silicon oxynitride layer, resulting in said nitride-oxide stack layer comprised of said silicon oxynitride layer, of a bottom portion of said silicon nitride layer, and of an underlying silicon oxide layer.

17. The method of claim 16, wherein said plasma nitridization procedure is performed at a temperature between about 25 to 700° C.

18. The method of claim 16, wherein said plasma nitridization procedure is performed at a power between about 100 to 300 watts, and at a pressure between about 1 mtorr to 10 torr.

19. The method of claim 16, wherein said plasma nitridization procedure is performed for a time of 5 sec, or greater.

20. The method of claim 16, wherein said plasma nitridization procedure is performed in a nitrogen ambient.

21. The method of claim 16, wherein said silicon nitride layer is formed at a thickness between about 5 to 30 Angstroms, via said plasma nitridization procedure, with the thickness of said silicon nitride layer obtained independent of plasma time.

22. The method of claim 16, wherein a refractive index of said silicon nitride layer is between about 1.95 to 2.05.

23. The method of claim 16, wherein said plasma oxidation procedure is performed at a temperature between about 200 to 700° C., in an oxygen ambient.

24. The method of claim 16, wherein said plasma oxidation procedure is performed at a power between about 100 to 3000 watts, and at a pressure between about 1 mtorr to 10 torr.

25. The method of claim 16, wherein said plasma oxidation procedure is performed for a time between about 5 to 60 sec.

26. The method of claim 16, wherein said silicon oxide layer is formed at a thickness between about 5 to 30 Angstroms.

27. The method of claim 16, wherein said silicon oxynitride layer is formed at a thickness between about 6 to 30 Angstroms.

28. The method of claim 16, wherein said nitride-oxide composite stack layer is comprised with an equivalent oxide thickness (EOT), between about 5 to 20 Angstroms.

* * * * *